(12) United States Patent
Shaw et al.

(10) Patent No.: US 7,491,578 B1
(45) Date of Patent: Feb. 17, 2009

(54) METHOD OF FORMING CRACK TRAPPING AND ARREST IN THIN FILM STRUCTURES

(75) Inventors: Thomas M Shaw, Peekskill, NY (US); Michael W Lane, Cortlandt Manor, NY (US); Xio Hu Liu, Briarcliff Manor, NY (US); Griselda Bonilla, Fishkill, NY (US); James P Doyle, Bronx, NY (US); Howard S Landis, Underhill, VT (US); Eric G Liniger, Sandy Hook, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/060,937

(22) Filed: Apr. 2, 2008

(51) Int. Cl.
*H01L 21/44* (2006.01)
*H01L 21/4763* (2006.01)

(52) U.S. Cl. .................. 438/106; 438/421; 438/619; 438/637; 257/E21.476

(58) Field of Classification Search .......... 438/106, 438/421, 619, 637
See application file for complete search history.

(56) References Cited

U.S. PATENT DOCUMENTS

| | | |
|---|---|---|
| 5,665,655 A | 9/1997 | White |
| 5,789,302 A | 8/1998 | Mitwalsky et al. |
| 5,834,829 A | 11/1998 | Dinkel et al. |
| 6,022,791 A | 2/2000 | Cook et al. |
| 6,025,639 A | 2/2000 | Mitwalsky et al. |
| 6,084,287 A | 7/2000 | Mitwalsky et al. |
| 6,271,578 B1 | 8/2001 | Mitwalsky et al. |
| 6,365,958 B1 | 4/2002 | Ibnabdeljalil et al. |
| 6,383,893 B1 | 5/2002 | Begle et al. |
| 6,806,168 B2 | 10/2004 | Towle et al. |
| 6,972,209 B2 | 12/2005 | Agarwala et al. |
| 7,067,902 B2 | 6/2006 | Hichri et al. |
| 7,091,621 B1 | 8/2006 | Eppes et al. |
| 7,098,676 B2 | 8/2006 | Landers et al. |
| 7,109,093 B2 | 9/2006 | Fitzsimmons et al. |
| 7,163,883 B2 | 1/2007 | Agarwala et al. |
| 7,223,673 B2 | 5/2007 | Wang et al. |
| 7,259,043 B2 | 8/2007 | Rolda, Jr. et al. |
| 7,314,811 B2 | 1/2008 | Tan et al. |
| 7,335,577 B2 | 2/2008 | Daubenspeck et al. |
| 2002/0024115 A1 | 2/2002 | Ibnabdeljalil et al. |
| 2004/0129938 A1 | 7/2004 | Landers et al. |
| 2005/0026397 A1 | 2/2005 | Daubenspeck et al. |
| 2005/0118803 A1 | 6/2005 | Hichri et al. |
| 2005/0208781 A1 | 9/2005 | Fitzsimmons et al. |
| 2006/0012014 A1 | 1/2006 | Chen et al. |
| 2006/0099775 A1 | 5/2006 | Daubenspeck et al. |
| 2006/0190846 A1 | 8/2006 | Hichri et al. |
| 2007/0069336 A1 | 3/2007 | Ning |
| 2007/0102792 A1 | 5/2007 | Wu |
| 2007/0108638 A1 | 5/2007 | Lane et al. |
| 2007/0194409 A1* | 8/2007 | Wang et al. ............... 257/620 |

* cited by examiner

*Primary Examiner*—Thanh Nguyen
(74) *Attorney, Agent, or Firm*—Leander F. Aulisio

(57) ABSTRACT

The present invention relates to a process for preparing a robust crack-absorbing integrated circuit chip comprising a crack trapping structure containing two metal plates and a via-bar structure sandwiched between said plates.

1 Claim, 3 Drawing Sheets

METHOD OF FORMING CRACK TRAPPING AND ARREST IN THIN FILM STRUCTURES

The present invention relates generally to the manufacturing process of integrated circuit chips. More specifically, the present invention relates to a crack stop structure to prevent the propagation of cracks during the dicing of wafers into individual chips.

BACKGROUND OF THE INVENTION

In order to minimize processing errors, maximize throughput by reducing the amount of time it takes to manufacture a given number of integrated circuit (IC) chips, and ease of handling considerations, a large number of IC chips are processed simultaneously on the surface of a wafer before the wafer is cut or "diced" into the individual chips. However, the dicing process may cause cracks in the active (wired) areas of the IC chips, thus resulting in chip failure. To reduce the amount of chip failure due to crack propagation during dicing and the resultant device failure, several processes have been developed including: a "free space" crack stop; a dicing channel; removing metal from the dicing channel; using a narrower dicing blade; and implementing an additional inspection process to reject damaged chips.

The following references relate to various examples of attempts to prevent cracking of chips. They are included as general interest.

U.S. Pat. No. 7,163,883 (Agarwala et al), issued Jan. 16, 2007, discloses an edge seal around the periphery of an integrated circuit device. The edge seal protects the copper circuitry from cracks that can form in the low-k interlevel dielectric layer during chip dicing. The edge seal comprises a dielectric wall between the copper circuitry and the low-k dielectric near the periphery of the IC device; the dielectric wall being of a different material than the low-k interlevel dielectric.

U.S. Patent Application Publication 2005/0026397 (Daubenspeck et al), published Feb. 3, 2005, relates to a crack stop for a low-k dielectric material of an integrated circuit formed on an IC chip. A moisture barrier or edge seal is formed as a metal stack positioned along the outer peripheral edges of the active area of the IC chip. The crack stop is formed by at least one trench or groove positioned outside of the barrier/seal on the outer periphery of the IC chip.

U.S. Pat. No. 5,834,829 (Dinkel et al), issued Nov. 10, 1998, discloses an energy relieving crack stop which is redundant. The redundant pattern allows the crack propagating energy that is not absorbed by the first ring of metallization to be absorbed by a second area of metallization. It also provides for a greater surface area over which the crack producing energy may spread. In the manufacturing process, the redundant crack stop is produced during the metallization process.

U.S. Pat. No. 6,972,209 (Agarwala et al), issued Dec. 6, 2005, relates to a multilevel semiconductor integrated circuit structure. Each layer of dielectric material includes at least one layer of low-k dielectric material. A set of stacked via studs is present in the layer of low-k dielectric material. The set of stacked via studs increases resistance to thermal fatigue crack formation.

U.S. Patent Application Publication 2005/0208781 (Fitzsimmons et al), published Sep. 22, 2005, and U.S. Pat. No. 7,109,093 (Fitzsimmons et al), issued Sep. 19, 2006, disclose methods of formation of an integrated circuit device structure. The structure has vertical interfaces adjacent crack stops around the perimeter of the chip. The vertical interfaces comprise vertical spacers of release materials, vertical trenches of release material or vertical channels of the release material. The vertical interfaces can act by: deflecting cracks away from the penetrating crack stop, absorbing the generated crack energies, or allowing the advancing cracks to lose energy such that they become incapable of penetrating the crack stop.

None of the references cited above, either separately or in combination, anticipate the inventive features of the present disclosure.

A process that would be simple and inexpensive, and would reliably prevent crack propagation into the active areas of the chips during the dicing process is therefore desirable.

SUMMARY OF THE INVENTION

Current trends in microchip fabrication are employing lower dielectric constant (k) materials in BEOL (back end of the line) processing. Preferably, ultra-low-k materials are employed as thin films. Such thin films are highly susceptible to cracking during operations such as processing or packaging. Chip dicing of processed wafers can cause cracks to originate at chip edges. Packaging can induce high stresses due to thermal expansion mismatch of chip material and packaging material. The high stresses lead to generation of cracks. If these cracks reach the active area of the chip, they cause electrical failure of the chip.

In one embodiment of the present invention, there is provided a crack trapping design that increases the crack trapping performance. This is preferably performed by a plurality of metal plates that are connected by means of a via-bar structure. The via-bar structure comprises a series of metal walls and vias (holes) in a type of patterned formation. The via-bar structure is positioned between the two metal plates. The structure is connected to the two metal plates by means known to one of ordinary skill in the art. Preferably, two metal plates are employed. The metal plates containing the via-bar structure are placed around the perimeter of the IC chip active area. The via-bar structure does not extend to the very end of the metal plates. In a preferred embodiment, the via-bar structure is recessed from the ends of the metal plates by a distance which is greater than the distance between the two metal plates. This allows for a section of the low-k dielectric layer to be positioned between the two metal plates. A propagating crack originating in a low-k dielectric material can enter the volume between the two metal plates, where the low-k dielectric material is present. The propagating crack is then absorbed by the extremely strong via-bar structure. Additionally, the propagating crack in the low-k dielectric layer is spread out over a greater amount of surface area around the active areas and, therefore, the cracks are less likely to enter the active areas.

It is an advantage of the present invention that the method of manufacturing the metal plates, having a via-bar structure positioned between the two metal plates, is relatively simple and cost effective. The metal structures comprising the crack trapping structures of the present invention are readily added during conventional BEOL processing. It is a further advantage of the present invention that the design of the crack stop structure of the present invention distributes crack energy more efficiently around a greater area, thereby reducing crack propagation into the chip active area. Cracks are not able to be deflected into a substrate of lower toughness and continue propagating. This is because the cracks are substantially completely trapped between the two metal plates of the crack trapping structure. The stress of the advancing crack is substantially confined to the tough metal area of the via-bar structure.

The foregoing and other features and advantages of the invention will be apparent from the following more particular description of preferred embodiments of the invention, as illustrated in the accompanying drawings.

DETAILED DESCRIPTION OF THE PRESENT INVENTION

An embodiment of the present invention is a crack trapping structure that includes two metal plates positioned at the periphery of an IC chip. The two metal plates are connected by a via-bar structure. The via-bar structure is offset from the ends of the metal plates, nearest the edge of the IC chip. Preferably the distance the offset of the via-bar structure is greater than the distance between the two metal plates.

Figure 1:
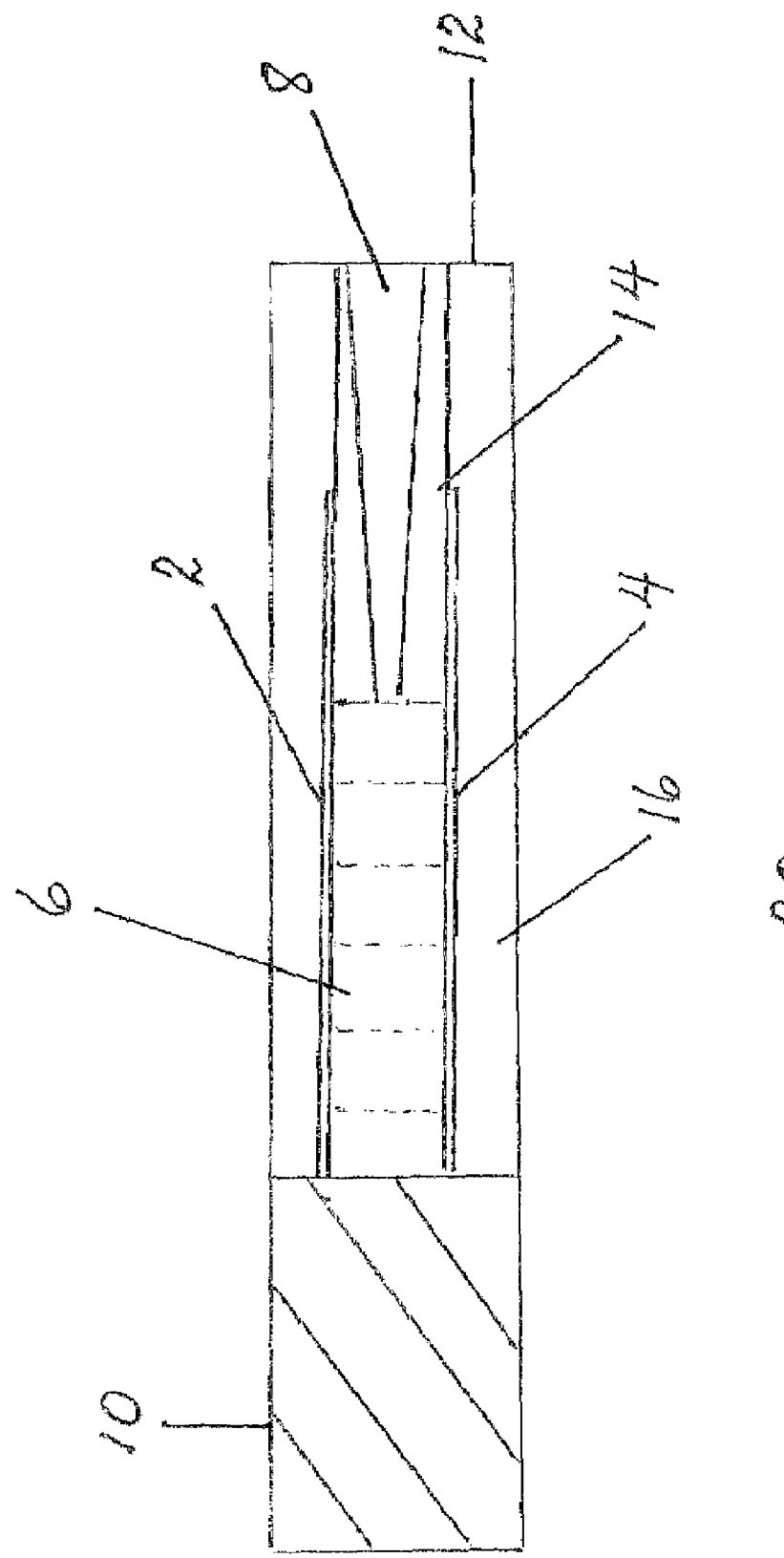
FIG. 1 is a schematic representation of an integrated chip having a crack trapping structure of the present invention, the crack stop structure comprising two metal plates having a via-bar structure positioned between the plates.

As shown in FIG. 1, the simplest design of the crack trapping structure of the present invention comprises two metal plates, 2 and 4, positioned around the periphery of an IC chip 20. The chip 20 contains an active area 10. The active area 10 comprises circuitry, diodes, resistors and the like. The two metal plates, 2 and 4, are connected by a via-bar structure 6. The via-bar structure 6 comprises a patterned design of metal walls and vias (holes). The crack trapping structure is easily manufactured; and readily incorporated into the IC chip during the standard BEOL processing steps. A crack 8 originates at an edge 12 of the IC chip 20. The crack 8 propagates inside an ultra-low-k dielectric layer 14 until it reaches the crack trapping structure of the present invention. Upon reaching the crack trapping structure, the crack 8 is substantially completely absorbed by the crack trapping structure. The crack cannot avoid the crack trapping structure and continue to propagate in a substrate layer 16 below the ultra-low-k dielectric layer because it is trapped by the metal plates, 2 and 4. Crack 8 is then absorbed by the via-bar structure 6.

In a typical chip manufacturing process, the transistors that make up the logic gates, diodes, etc., are implanted into the chip surface, the gate materials are applied and defined, and an insulative material is deposited over the gated surface and planarized. A series of metallization and contact layers are then utilized to interconnect the various devices on the chip surface. These metallization and contact layers include areas of metallization for electrical connections and areas of passivating or insulative material for electrical isolation. In order to form the necessary electrical connections with the gates, vias or holes are etched into the insulative material to reach the devices and filled with metal. The process by which the vias or holes are selectively etched into the insulative material is typically a photolithographic procedure, followed by a reactive in etch process, both of which are commonly known in the art. The process of depositing the metal into the lines, vias and holes formed by selectively etching these areas can be done in a variety of ways. The most commonly practice method today is by depositing copper in a CVD (chemical vapor deposition) tool and polishing away the excess copper using a chemical mechanical polish (CMP) as commonly known in the art. Alternately, one may use electrode deposition processes, i.e., plating or physical sputtering at a hot temperature again followed by a CMP process.

After the construction of the active area of the chip, as outlined above, the crack trapping structure of the present invention can be readily formed during BEOL processing.

The crack trapping structure containing the two metal plates connected by a via-bar structure can be manufactured in a variety of designs. In one embodiment of the invention, the crack trapping structure contains a via-bar structure that has a non-linear front. The front of the via-bar structure is the area of the structure that originally meets the propagating crack. When an irregular front is employed as the design for the via-bar structure, the more advanced parts of the crack front experience a reduced driving force. It has been observed that the crack trapping structure of the present invention has a toughness as high as 36 Joules per square meter.

Figure 2:
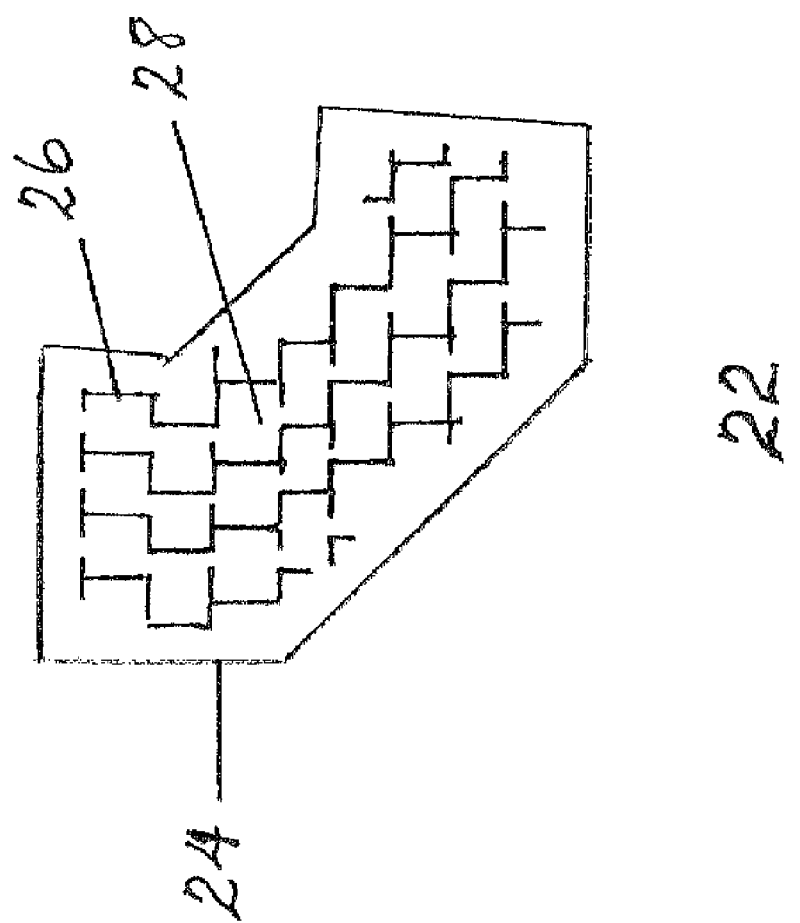
FIG. 2 is a schematic representation of a via-bar structure having a non-linear front.

FIG. 2 is a diagram of a via-bar structure 22 that has a front 24 that is non-linear. The front 24 receives the full force of the propagating crack, the crack propagating through an ultra-low-k dielectric layer which is very thin and weak. The via-bar structure comprises metal or ceramic walls 26 and vias or holes 28, arranged in a suitable pattern. Usually, the crack can continue along another line of propagation when it meets an obstacle that it cannot penetrate. In one situation, the crack sinks into the substrate level of the IC chip and continues to propagate until it reaches the active area of the chip, thus destroying the integrity of the chip. When the crack trapping structure of the present invention is employed, the propagating crack is trapped between the two metal plates (not shown) and absorbed by the via-bar structure 22. Preferably, the via-bar structure 22 has a front 24 that is angled or curved so that the crack is more readily absorbed by the structure.

Figure 3:
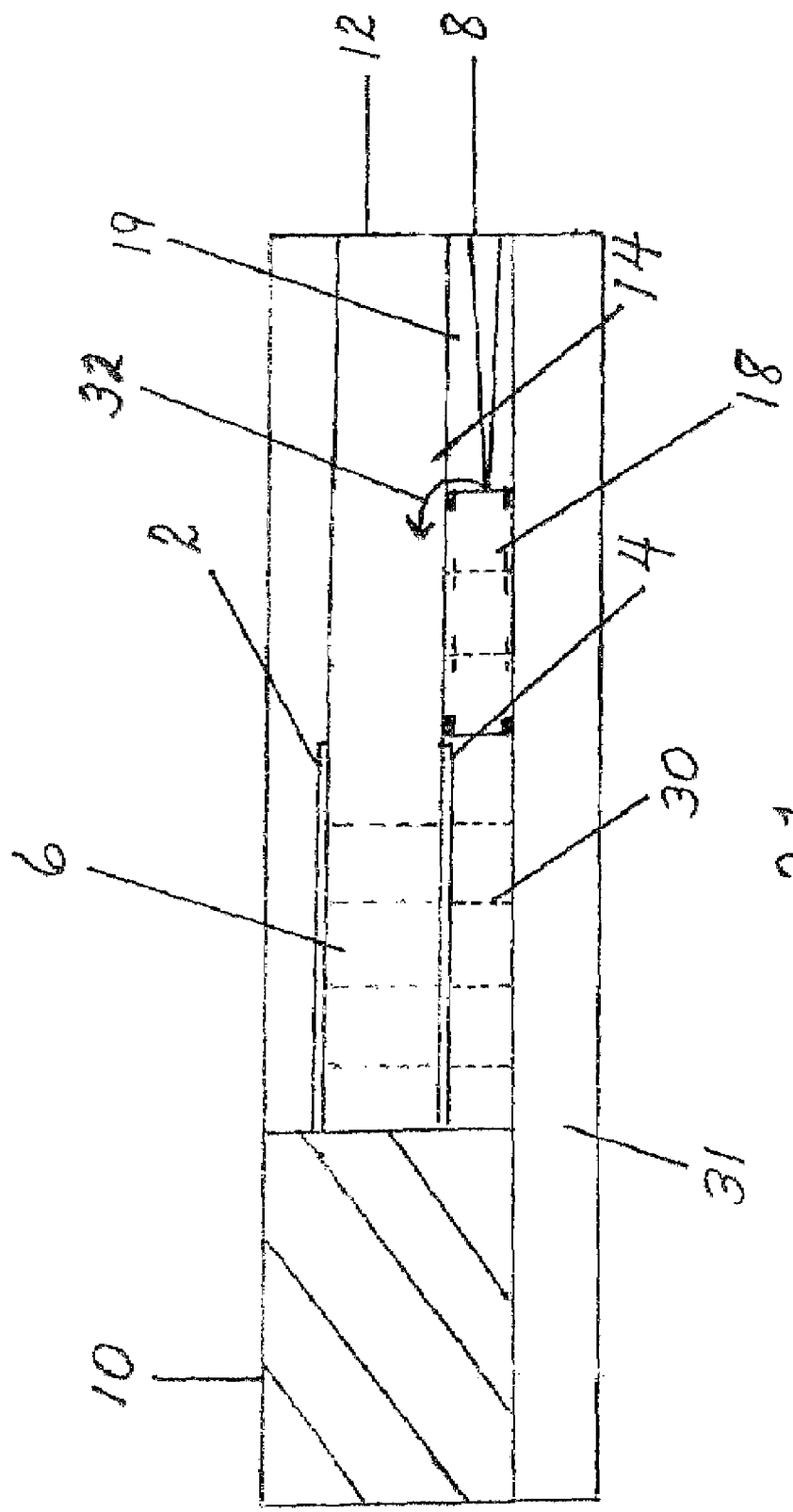
FIG. 3 is a schematic representation of an integrated chip having another embodiment of a crack stop structure of the present invention, the crack trapping structure comprising two metal plates having a first via-bar structure positioned between the plates, and a second via-bar structure extending beyond the two metal plates.

FIG. 3 is an alternative design for the crack trapping structure of the present invention. In the case where the lowest level on the silicon wafer 31 is a via structure 30 in a dielectric material 19, it is not possible to place a metal plate below the via structure 30 because the via 30 directly contacts the silicon substrate 31. A propagating crack 8 can readily deflect away from the crack trapping structure of FIG. 1 and move into the lower silicon substrate 31. The silicon substrate 31 offers no resistance to the propagating crack 6 because it is brittle. The toughness of the silicon substrate 31 is approximately only 6 joules per square meter. The design of FIG. 3 solves this problem by extending a second via-bar structure 18 beyond the ends of the metal plates 2 and 4. The second via-bar structure 18 can be constructed to begin below and at the end of the lower metal plate 4 and extend a distance toward the edge 12 of the chip 21. The distance can be at least equal to the length of the metal plates. In FIG. 3, the two metal plates, 2 and 4, are positioned around the periphery of an IC chip 21. The chip 21 contains an active area 10. The active area 10 comprises circuitry, diodes, resistors and the like. The two metal plates, 2 and 4, are connected by a first via-bar structure 6. The first via-bar structure 6 comprises a patterned design of metal walls and vias (holes). A second via-bar structure 18 is positioned below the lower metal plate 4, and extends toward the edge 12 of the IC chip 21. The second via bar structure 18 comprises a patterned design of metal walls and vias (holes). The crack trapping structure is easily manufactured; and readily incorporated into the IC chip 21 during the standard BEOL processing steps. A crack 8 originates at an edge 12 of the IC chip 21. The crack 8 does not propagate inside a first ultra-low-k dielectric layer 14, but rather propagates inside a dielectric layer 19. The dielectric layer 19 contains an array of vias 30 which are positioned directly below the metal plate 4. If the design of FIG. 1 is employed, the crack 8 would reach the array of vias 30 and deflect into the weak silicon layer 31. With the alternative design of FIG. 3, the crack 8 is deflected back into the ultra-low-k dielectric layer 8. The crack 8 follows path 32, where it can be trapped between metal plates 2 and 4. It is substantially completely absorbed by the crack trapping structure because its concentrated stress is confined to the metal structures. The crack 8 cannot avoid the crack trapping structure; and it cannot continue to propagate into the silicon substrate layer 31.

Another embodiment of the present invention is a process for preparing a robust integrated circuit chip. The robust chip resists any crack that originates at the edges of the chip in the ultra-low-k dielectric layer of the chip. The crack is prevented from reaching the active area of the chip and destroying the integrity of the chip. The process comprises manufacturing an integrated circuit chip comprising a chip active area having a perimeter comprising at least a section of an ultra-low-k dielectric layer. The process further comprises forming a crack trapping structure during the manufacturing of the chip. The crack trapping structure is arranged around the perimeter of the chip, outside the centrally located active area. The crack trapping structure is operationally disconnected from the chip active area. The crack trapping structure comprises a via-bar structure sandwiched between two metal plates. The via-bar structure can be directly attached to the two metal plates as by means known to one of ordinary skill in the art. In an alternative embodiment, the via-bar structure is not directly attached to the two metal plates, but is simply positioned between said plates. The via-bar structure does not extend to the end of the metal plates near an edge of the chip. This allows for an amount of the at least one section of the ultra-low-k dielectric layer to be positioned between the two metal plates at a position not occupied by the via-bar structure. A robust integrated circuit chip is thus obtained. A crack generated at the edge of the chip and propagating through the ultra-low-k dielectric layer is substantially completely absorbed by the crack stop structure.

An embodiment of the present invention is an electronic apparatus comprising an integrated circuit chip, the integrated circuit chip comprising a centrally located active area having a perimeter. The chip comprises at least one layer of an ultra-low-k dielectric material. A crack trapping structure is arranged around the perimeter of the chip active area; and contains at least a part of the at least one layer of ultra-low-k dielectric material. The crack trapping structure is operationally disconnected from the chip active area. The crack trapping structure comprises a via-bar structure sandwiched between two metal plates. The section of the ultra-low-k dielectric layer that is positioned between the two metal plates is at a position furthest from the centrally located chip active area.

Although the above descriptions relate to BEOL structures, the present invention is not limited to such structures. The crack trapping structures, as described above in various embodiments, can be employed in the prevention of crack propagation in any layered structure or laminate such as a packaging structure or a printed circuit board.

While the invention has been described by specific examples and embodiments, there is no intent to limit the scope of the inventive concept except as set forth in the following claim.

We claim:

1. A process for preparing a robust integrated circuit chip comprising:

manufacturing an integrated circuit chip comprising a centrally located chip active area having a perimeter comprising at least a section of an ultra-low-k dielectric layer, and during the manufacturing process, forming a crack trapping structure, the structure arranged around the perimeter of the chip, outside the centrally located active area, and operationally disconnected from the chip active area; wherein the crack trapping structure comprises a via-bar structure sandwiched between two metal plates; and wherein the via-bar structure does not extend to the end of the metal plates near an edge of the chip, the via-bar structure being recessed from the ends of the metal plates by a distance which is greater than the distance between the two metal plates, wherein the via-bar structure comprises a plurality of walls and a plurality of holes, wherein each wall extends between said two metal plates and is selected from the group consisting of metal walls and ceramic walls; to obtain the robust integrated circuit chip; whereby a crack generated at the edge of the chip and propagating through the ultra-low-k dielectric layer is substantially completely absorbed by the crack trapping structure.

\* \* \* \* \*